United States Patent

Dasgupta

[11] Patent Number: 6,144,238
[45] Date of Patent: Nov. 7, 2000

[54] INTEGRATED POWER-ON-RESET CIRCUIT

[75] Inventor: Uday Dasgupta, Singapore, Singapore

[73] Assignee: Tritech Microelectronics, Ltd., Singapore, Singapore

[21] Appl. No.: 09/151,156

[22] Filed: Sep. 10, 1998

[51] Int. Cl.[7] .................................................. H03L 7/00
[52] U.S. Cl. ............................................................ 327/143
[58] Field of Search ................................. 327/142, 143, 327/198

[56] References Cited

U.S. PATENT DOCUMENTS

| | | | |
|---|---|---|---|
| 4,697,097 | 9/1987 | Rusznyak | 307/296 R |
| 5,109,163 | 4/1992 | Bebhamida | 307/272.3 |
| 5,172,012 | 12/1992 | Ueda | 307/272.3 |
| 5,187,389 | 2/1993 | Hall et al. | 307/350 |
| 5,300,822 | 4/1994 | Sugahara et al. | 307/272.3 |
| 5,483,187 | 1/1996 | Jang | 327/143 |

*Primary Examiner*—Jeffrey Zweizig
*Attorney, Agent, or Firm*—George O. Saile; Stephen B. Ackerman

[57] ABSTRACT

A circuit and a method are disclosed which offer a solution for integrating a power-on-reset circuit that is realizable in a small space, consumes very little power, and works for practically any rate of rise of the power supply. These goals have been achieved by detecting, in a first section of the circuit, when the supply voltage reaches the threshold voltage $V_{TP}$ of a p-channel transistor, and activates power-on-reset by forcing that signal to logical zero (active). This first section detects next when the supply voltage reaches $2V_{TP}$ and signals to a second section of the circuit to start charging a capacitor. The charging rate of the capacitor is controlled in such a way that its voltage lags behind the supply voltage, so that if the rise of the supply voltage is very fast, the duration $T_D$ of power-on-reset is long enough to insure complete resetting of the circuits it serves, such as digital memory elements, digital registers etc. A third section of the circuit monitors the voltage of the capacitor and when this capacitor voltage has reached a certain predetermined percentage of the supply voltage, this third section terminates power-on-reset by switching that signal to logical one (inactive).

21 Claims, 3 Drawing Sheets

INTEGRATED POWER-ON-RESET CIRCUIT

RELATED PATENT APPLICATION

TMI97-012, INTEGRATED SELF-TIMING POWER START-UP RESET CIRCUIT, title filing date: Apr. 10, 1998, Ser. No. 09/058124, assigned to a common assignee.

BACKGROUND OF THE INVENTION

1. Field of the Invention

The invention relates to the resetting of digital circuits, and more particularly to integrated circuits generating self-timed power-on-resets without use of external timing elements or digital counters.

2. Description of the Related Art

A power-on-reset signal is required by digital circuits involving memory elements or flip-flops to set the initial state immediately after power on. This signal was traditionally generated externally using an external RC circuit or simply by a switch, the latter requiring manual intervention.

The problem of integrating the first technique was with the rate of rise of the power supply, which is usually very slow. As a result, the RC time constant needs to be very large for successful generation of a power-on-reset signal. Realization of such high time constants on chip takes up too much space to be practically viable, although the same may be easily realized externally.

Three U.S. Patent have been issued dealing with the power-on-reset circuits.

U.S. Pat. No. 5,300,822 (Sugahara, et al.) is somewhat similar to the invention in that a power-on-reset signal is provided once the supply voltage reaches the sum of $V_{TN}$ and $V_{TP}$, however, the circuit differs from that of the invention.

U.S. Pat. No. 5,172,012 (Ueda) provides a power-on-reset circuit which provides a POR output signal independently of the rises time of the supply voltage, but in a different way from the invention.

U.S. Pat. No. 5,483,187 (Jang) describes a power-on-reset circuit which also outputs a reset pulse regardless of the supply voltage rise rate, but using a Schmitt trigger and state latch circuit.

SUMMARY OF THE INVENTION

It is an object of the present invention to provide an integrated circuit and a method which offer a solution for integrating a power-on-reset circuit that is realizable in a small space, consumes very little power, and works for practically any rate of rise of the power supply.

Another object of the present invention is to provide an integrated circuit for power-on-reset which does not require resistors and uses few transistors of relatively small sizes.

A further object of the present invention is to provide an integrated circuit function which is relatively independent of temperature and process variations.

These objects have been achieved by detecting, in a first section of the circuit, when the supply voltage reaches the threshold voltage $V_{TP}$ of a p-channel transistor, and activates power-on-reset by forcing that signal to logical zero (active). This first section detects next when the supply voltage reaches $2V_{TP}$ and signals to a second section of the circuit to start charging a capacitor. The charging rate of the capacitor is controlled in such a way that its voltage lags behind the supply voltage, so that if the rise of the supply voltage is very fast, the duration $T_D$ of power-on-reset is long enough to insure complete resetting of the circuits it serves, such as digital memory elements, digital registers etc. A third section of the circuit monitors the voltage of the capacitor and when this capacitor voltage has reached a certain predetermined percentage of the supply voltage, this third section terminates power-on-reset by switching that signal to logical one (inactive).

DESCRIPTION OF THE PREFERRED EMBODIMENT

The present invention provides a solution for integrating a power-on-reset circuit that is realizable in a small space, consumes very little power, and works for practically any rate of rise of the power supply.

The reason why a very large time constant is needed for a very slow rising power supply is because, otherwise, the timing capacitor would acquire full charge very quickly and the voltage across it would follow the power supply from a very low value. As a result, the digital memory elements that must be reset cannot detect any change in level when they become operative at a certain value of the power supply voltage and hence do not get reset at all. This problem has been overcome in the invention by starting the timing circuitry that generates the reset period only after the power supply reaches a level that is sufficient for the digital logic circuits to be fully operative. This enables the digital memory elements to reset successfully irrespective of the rate of rise of the power supply.

Figure 1:
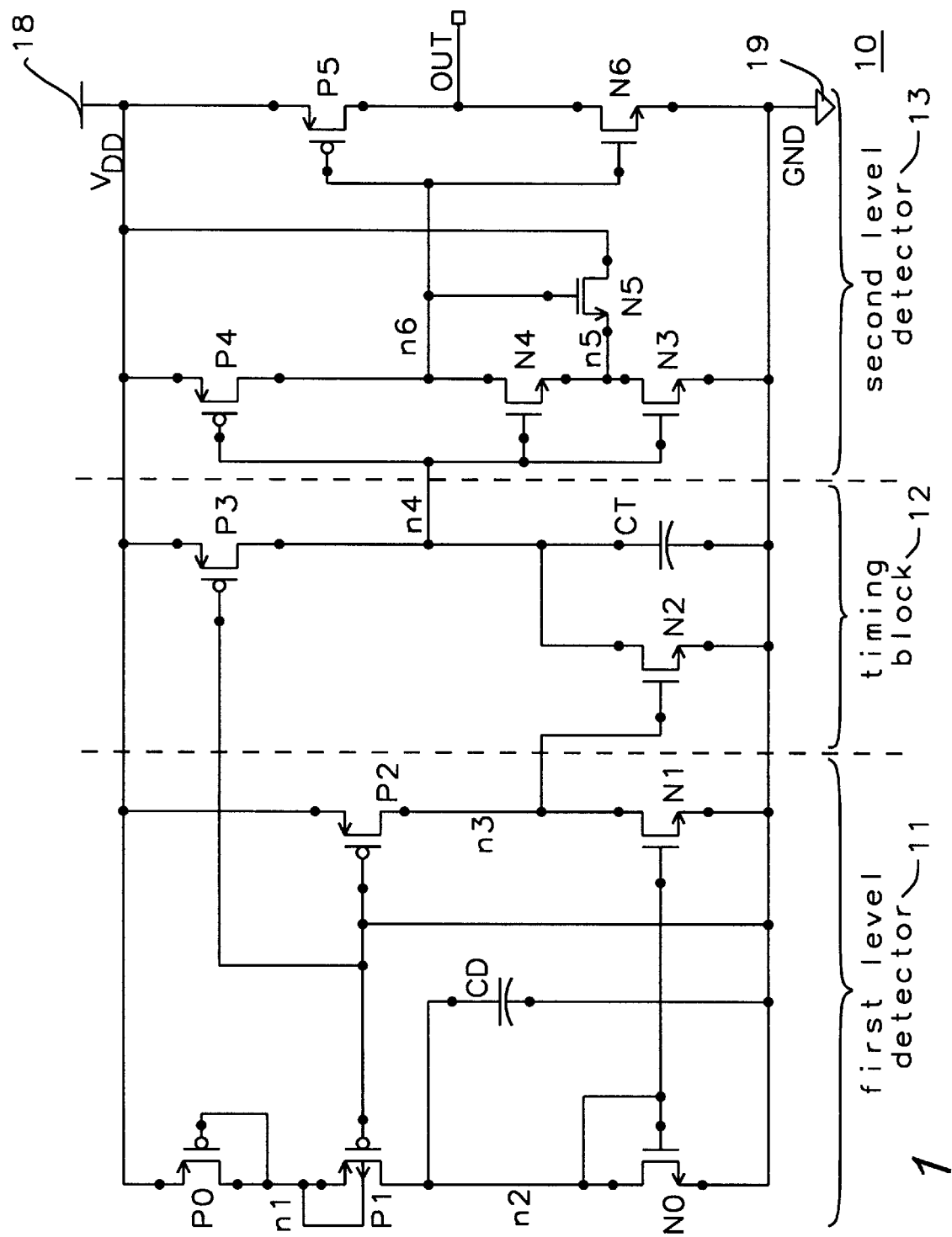
FIG. 1 is a circuit diagram of the present invention.

Referring now to FIG. 1, we show the power-on-reset circuit 10 of the invention. Transistors P0, P1, P2, N0, and N1 serve as a first level detector 11 for the power supply 18 ($V_{DD}$). The function of this block is to provide, at the output node n3, a high logic level when the power supply has a value between $V_{TP}$ and $2V_{TP}$ and a low logic level when the same is above $2V_{TP}$. $V_{TP}$ is the absolute value of the threshold voltage of a PMOS transistor. The state of n3 is not important for values of the power supply below $V_{TP}$. It is worth mentioning here that with the power supply above $2V_{TP}$, digital logic can function properly. The minimum value needed for digital logic to be operative is $V_{TP}+V_{TN}$ where $V_{TN}$ is the threshold voltage of a NMOS transistor. Usually $V_{TP}$ is larger than $V_{TN}$.

The above functionality is achieved as follows: P0 and P1, which are identical transistors, are connected as shown to form a composite transistor with threshold voltage of $2V_{TP}$. P2 is a normal transistor with threshold voltage $V_{TP}$. This argument is explained in the section Design Equations. Therefore, P0, P1 turn on when the power supply exceeds $2V_{TP}$, whereas P2 turns on when the power supply exceeds $V_{TP}$ only. The aspect ratios of P0, P1 and P2 are adjusted such that P0, P1, and P2 carry nearly equal currents when they are on. N0 and N1 form a current mirror with N1 sized about 2–5 times larger than N0. As the power supply rises from a zero value and reaches $V_{TP}$, P2 turns on. Since at that moment, P0, P1 is not on, N0 and therefore N1 carry no current. As a result, the output node n3 is pulled high by P2. The logical high state of the output node n3 is maintained till the power supply reaches $2V_{TP}$ as it rises further. Now P0, P1 turns on and carries about the same current as P2. This current is multiplied by an amount equal to the ratio of the aspect ratio of N1 to that of N0 and therefore assumes a larger value than the current carried by P2. As a result, the output node n3 is now pulled low by N1. This logic state of the output continues even after the power supply has reached its final value and so long it does not drop below $2V_{TP}$.

Again referring to FIG. 1, the second block of the circuit is the timing block 12 comprising of transistors P3 and N2 and a capacitor $C_T$. P3 acts as a resistor charging up $C_T$. N2 acts as a reset switch for the purpose of discharging $C_T$. The output node n3 of the previous block controls N2.

Continuing with FIG. 1, when the power supply voltage, rising from a zero value, exceeds $V_{TP}$, N2 turns on as the node n3 goes high, thereby discharging $C_T$, and pulling the output node n4 of this block to a logical low level. This condition continues till the power supply voltage exceeds $2V_{TP}$. Beyond that value, N2 switches off as the node n3 goes low, allowing $C_T$ to charge up through P3 which had turned on at the time when the power supply voltage exceeded $V_{TP}$. As a result, the node n4 then rises towards the power supply rail and finally settles at a value equal to the power supply voltage.

Still referring to FIG. 1, the following and the final block acts as a level detector 13 for the voltage at n4. It comprises of transistors P4, N4, N3 and N5, which is basically a half section of an inverting Schmitt trigger, and transistors P5 and N6 acting as an inverter. On the whole, the entire block outputs a low at OUT when the voltage at n4 is between zero and a predetermined level $V_H$ which is typically about 80% of the power supply voltage and outputs a high at OUT when the voltage at n4 exceeds $V_H$.

Referring once again to FIG. 1, as the voltage at n4 increases from a zero value while $C_T$ charges up, the logical level at OUT is low since N3 is off and P4 is on with the node n6 high. As the voltage at n4 exceeds $V_{TN}$, the threshold voltage of N3, it turns on. N5 and N3 now act as a voltage divider across the power supply. The aspect ratios of N3 and N5 are adjusted such that the voltage at n5 is typically around half the power supply. Therefore unless the voltage at n4 exceeds a value $V_H$, which is equal to the voltage at node n5 plus $V_{TN}$, N4 remains off and therefore the voltage at OUT is low. Once the voltage at n4 exceeds $V_H$, N4 turns on, the voltage at n6 reduces, and so does the voltage at n5, thus further turning on N4 with a regenerative action till the voltage at n6 is goes low all the way to ground 19 and OUT goes high.

To any external digital memory elements using the power-on-reset signal at OUT, the period for which it remains low is the reset active period. When it goes high, reset is inactive. Charging of $C_T$ starts only after the power supply has reached a level so that the digital circuitry is able to function. OUT is low at that instant resetting all the memory elements. This reset action continues for a time period $T_D$ (which is the time required for $C_T$ to charge up to $V_H$) and subsequent to that OUT goes high releasing reset thus allowing the digital memory elements to function with the desired initial state. Thus with this scheme, a proper power-on-reset signal can be generated irrespective of the rate of rise of the power supply.

After the power supply has reached a steady value, current is drained from the power supply only through the composite transistor P0, P1 and the transistor P2. Therefore by choosing proper aspect ratios for those transistors, the steady state power consumption of the circuit can be made very low. However, this may cause the circuit not to work properly for fast rising power supplies due to the time taken for the voltage at node n3 to rise and the capacitor $C_T$ to discharge. This problem is overcome by adding a capacitor $C_D$ at node n2 as shown. This capacitor allows the node n3 to rise by slowing down the turning on of N1.

Referring once again to FIG. 1, we describe the preferred embodiment of integrated circuit 10 in greater detail:

First level detector 11 with node n3 as output, timing block 12 with node n3 as input and node n4 as output, and second level detector 13 with node n4 as input and node OUT as output, are connected between supply voltage rail 18, commonly $V_{DD}$, and reference potential rail 19, commonly GND.

First Level Detector 11

P-channel transistor P0 has its source connected to rail 18 and its drain and gate to the source of p-channel transistor P1. P1's substrate is connected to its source, its gate is connected to rail 19, and its source to the drain of n-channel transistor N0. N0's source is connected to rail 19, and its gate is connected to its drain. Capacitor $C_D$ is connected between the drain of p-channel transistor P1 and rail 19. P-channel transistor P2 has its source connected to rail 18 and its drain to node n3. P2's gate is connected to rail 19. The drain-source of n-channel transistor N1 is connected between node n3 and rail 19, and N1's gate is tied to the gate of N0.

Timing Block 12

P-channel transistor P3 has its source attached to rail 18, its gate to rail 19, and its drain to node n4. The drain of n-channel transistor N2 is connected to node n4, its source to rail 19, and its gate to node n3. Capacitor $C_T$ is tied to node n4 and rail 19.

Second Level Detector 13

P-channel transistor P4 has its source connected to rail 18, its gate to node n4, and its drain to node n6. N-channel transistors N3 and N4 are connected in series between rail 19 and node n6, where the source of N3 is connected to rail 19 and the drain of N4 is connected to node n6. The gates of N3 and N4 are tied to node n4. N-channel transistor N5 has its drain connected to rail 18 and its source to the junction between N3 and N4. The gate of N5 is tied to node n6. P-channel transistor P5 has its source connected to rail 18 and its gate to node 6. P5's drain is connected to node OUT. N-channel transistor N6 has its drain tied to node OUT, its source to rail 19, and its gate to node n6.

Figure 2:
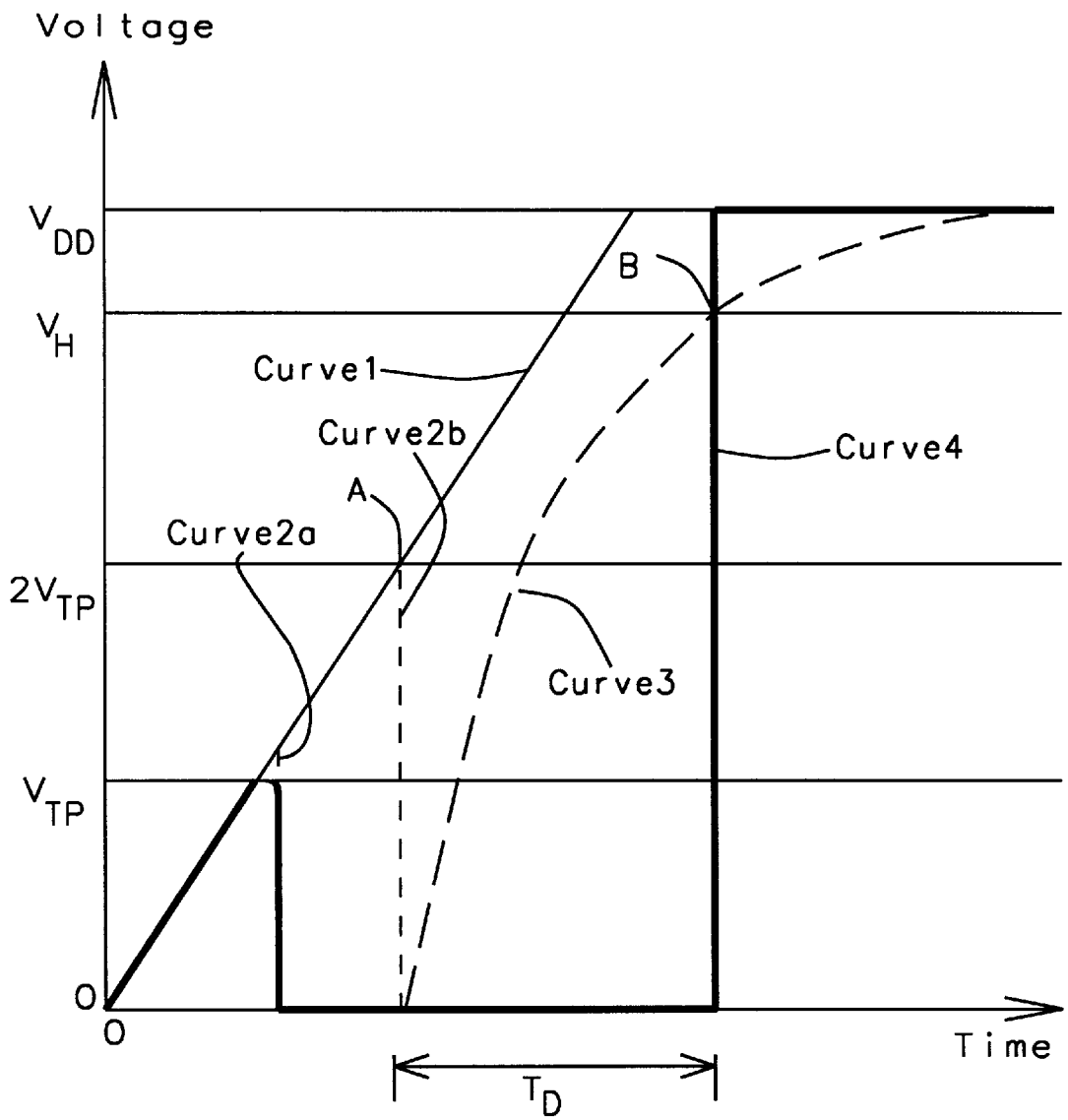
FIG. 2 is a view of the input and output signals of the circuit as shown in FIG. 1.

We now refer to FIG. 2, a graph of waveshapes at various nodes of the circuit of FIG. 1. Curve 1 depicts the rising supply voltage, reaching an ultimate value of $V_{DD}$. Curve 2a depicts node n3 rising steeply after $V_{TP}$ is reached and following the rise of the supply voltage till $2V_{TP}$ (Point A). At $2V_{TP}$ node n3 drops steeply as shown by Curve 2b. Curve 3, depicting the voltage of capacitor $C_T$ at node 4, shows node 4 rising as node 3 drops. Curve 3, though rising rapidly, always lags behind Curve 1. Curve 4 represents the power-on-reset signal. The power-on-reset signal at node OUT is already at or near the reference potential (equal to active) when the rising supply voltage, Curve 1, has reached two times the threshold voltage $V_{TP}$ (Point A). Where $V_{TP}$ is the threshold voltage of a p-channel transistor. The power-on-reset signal maintains that reference potential until capacitor $C_T$ has charged up to a predetermined percentage of the supply voltage. This value is $V_H$ in FIG. 2, and is indicated by Point B. The preferred percentage of $V_H$ is 80%, but may range from 75 to 85%. The power-on-reset signal at node OUT switches to the supply voltage level (equal to inactive) once that predetermined percentage of the supply voltage has been exceeded at node n4. The time delay between Points A and B is $T_D$. Power-on-reset is kept low (active) between the rise of Curve 2a and the fall of Curve 2b, by keeping $C_T$ discharged. This prevents the failure of the power-on-reset circuit to work due to any previous charge held by $C_T$.

Figure 3:
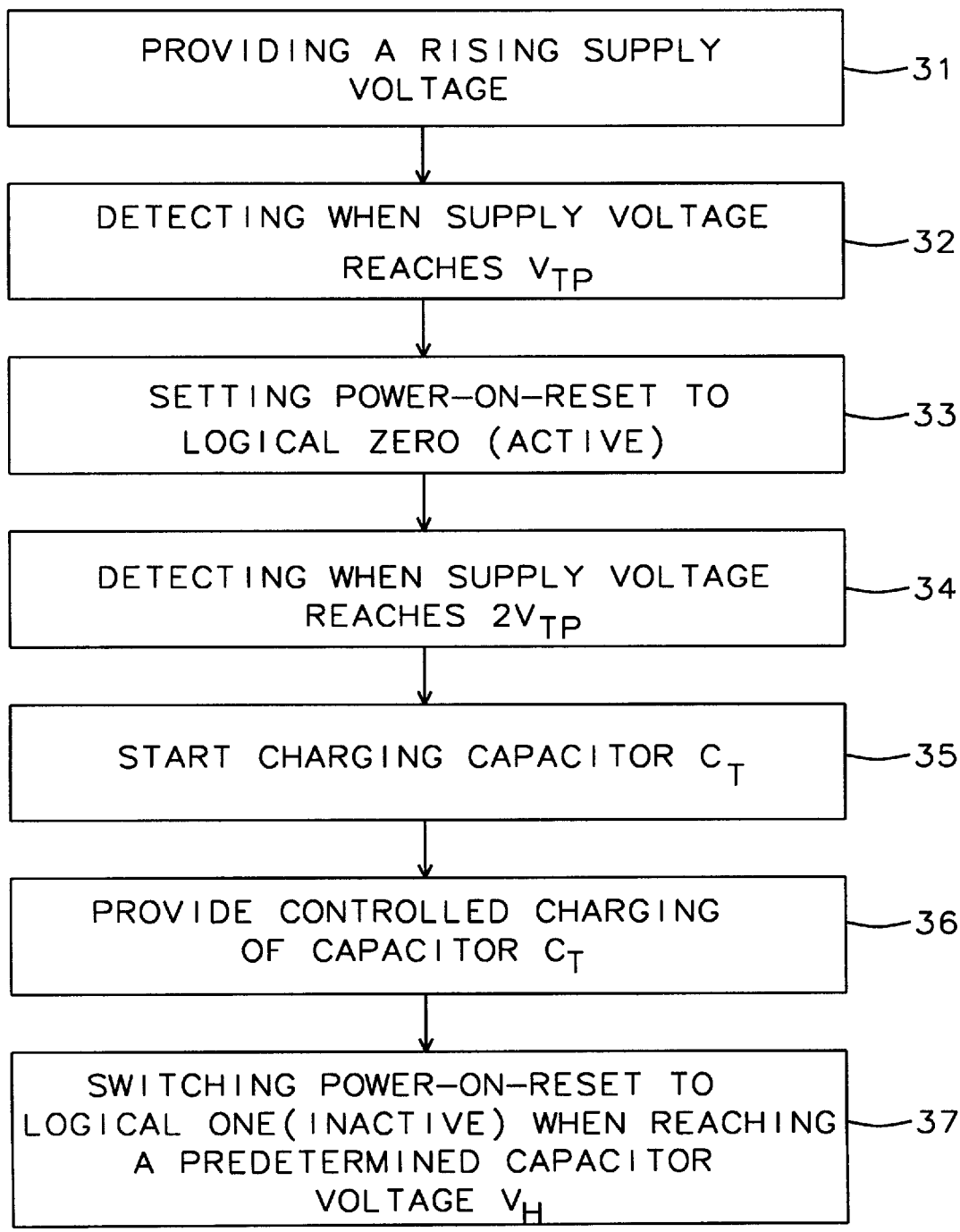
FIG. 3 is a block diagram of the method of the present invention.

Using the block diagram of FIG. 3, we now describe the method of the present invention of generating a self-timed power-on-reset. Block 31 provides a supply voltage rising to a fixed voltage. Next in Block 32 and 33, the method is providing a first level detecting means to set a power-on-reset signal to logical zero (active) when said supply is at the threshold voltage $V_{TP}$ of a p-channel transistor. Block 34 shows detecting when said supply voltage is at two times said threshold voltage $V_{TP}$. The next step, shown in Block 35, is providing a timing means that starts charging a capacitor when said supply voltage is at two times said threshold voltage $V_{TP}$; followed in Block 36 by charging said capacitor at such a rate that the voltage impressed on said capacitor lags behind the voltage of said rising supply voltage. Block 37 is providing a second level detecting means that switches said power-on-reset to logical one (inactive) at a predetermined voltage $V_H$, when said voltage impressed on said capacitor has risen from two times the threshold voltage of said p-channel transistor to said predetermined voltage $V_H$.

Note that in this method the supply voltage supplies power to the first level detecting means, to the timing means, to the second level detecting means, and to the digital circuits receiving that power-on-reset signal, so that all circuits are affected the same way by the rising supply voltage. The timing means charges the capacitor to the predetermined voltage in a time $T_D$ which is determined to be sufficient to allow for a complete power-on-reset.

Capacitors $C_D$ and $C_T$ are typically 10 pF, but may range from 5 pF to 20 pF. Capacitor $C_{N4}$ is commonly realised with a MOS transistor. Aspect ratios for P0, P1, and P2, N0 and N1, N3 and N5 depend on a variety of factors; however, these aspect ratios and the size of $C_D$ can be determined from the following section Design Equations.

DESIGN EQUATIONS

1. Current Equations for P0, P1, and P2

We start with the current equation of the metal-oxide-semiconductor (MOS) transistor in the saturation region:

$$I_D = (\tfrac{1}{2}) \cdot \beta (V_{GS} - V_{TH})^2 \quad (1)$$

$$\beta = \mu C_{OX}(W/L) \quad (2)$$

where
- $I_D$ = saturation drain current.
- $V_{GS}$ = gate-source voltage.
- $V_{TH}$ = threshold voltage.
- $\mu$ = mobility.
- $C_{OX}$ = gate capacitance per unit area.
- (W/L) = aspect ratio.

Applying the above to the composite transistor P0, P1 and considering only absolute values for current, terminal voltages and threshold voltages, the drain current equation for P1, assuming P0 and P1 to be identical, can be written as:

$$I_{P1} = (\tfrac{1}{2}) \cdot \beta_{P1}[V_{GS} - 2V_{TP} - (2I_{P1}/\beta_{P1})^{1/2}]^2 \quad (3)$$

where $\beta_{P1} = \beta$ and $V_{TP} = V_{TH}$ for P0 or P1.
The solution of (3) is:

$$I_{P1} = (\tfrac{1}{8}) \cdot \beta_{P1}(V_{GS} - 2V_{TP})^2 \quad (4)$$

Since $V_{GS}$ for both P2 and the pair P0, P1 is the power supply voltage $V_{DD}$ in FIG. 1, the current equations for P0, P1 pair and P2 are obtained from (4) and (1), respectively as:

$$I_{P1} = (\tfrac{1}{8}) \cdot \beta_{P1}(V_{DD} - 2V_{TP})^2 \quad (5)$$

$$I_{P2} = (\tfrac{1}{2}) \cdot \beta_{P2}(V_{DD} - V_{TP})^2 \quad (6)$$

where $\beta_{P2}$ is the $\beta$ for P2.

(5) and (6) clearly show that the composite transistor P0, P1 has double the $V_{TH}$ of a normal transistor P1, but one fourth the multiplier of $\beta$. $\beta_{P1}$ and $\beta_{P2}$ have common multipliers $\mu_P C_{OX}$, where $\mu_P$ is the mobility of a p-channel transistor. $\mu_P C_{OX}$ is a process and temperature dependent parameter. Because of this, the characteristics of P0, P1, and P2 will track with temperature and process variations.

2. Expression for Schmitt-Trigger Threshold Voltage $V_H$

In FIG. 1, using (1), $$I_{N3} = (\tfrac{1}{2}) \cdot \beta_{N3}(V_{n4} - V_{TN})^2 = I_{n5} \quad (7)$$

where $V_{n4}$ is the input voltage at node n4.
Using (7) and (1), $$V_{n5} = V_{DD} - V_{TN} - \sqrt{\frac{(W/L)_{N3}}{(W/L)_{N5}}} \cdot (V_{n4} - V_{TN}) \quad (8)$$

where $V_{n5}$ is the voltage at node n5.
Now:

$$V_{n4} = V_{GSN4} + V_{n5} \quad (9)$$

where $V_{GSN4}$ is the $V_{GS}$ of transistor N4.
Now, the Schmitt-Trigger trips when $V_{n4} = V_H$ and $V_{GSn4} = V_{TN}$. Substituting this in (8) and (9), we have:

$$V_H = \frac{V_{DD} + V_{TN}}{1 + \sqrt{\frac{(W/L)_{N3}}{(W/L)_{N5}}}} \quad (10)$$

3. Expression for Timing Interval $T_D$

The timing starts (t=0) when $V_{dd}$ or the power supply voltage reaches a value of $2V_{TP}$. So we can write:

$$V_{dd}(t) = kt + 2V_{TP} \quad (11)$$

where 't' is time and 'k' is the time rate of rise of the power supply voltage.
Using (1) and (11), the charging current to $C_T$ is given by:

$$I_{P3} = (\tfrac{1}{2}) \cdot \beta_{P3}(kt + V_{TP})^2 \quad (12)$$

The voltage across $C_T$ is given by:

$$V_{n4} = \frac{1}{C_T} \int_0^t I_{P3} \cdot dt \quad (13)$$

Using (13) and (12) we can find:

$$V_{n4} = \frac{k^2 \cdot \beta_{P3}}{6C_T} \left[ \left(t + \frac{V_{TP}}{k}\right)^3 - \left(\frac{V_{TP}}{k}\right)^3 \right] \quad (14)$$

At $t=T_D$, $V_{n4}=V_H$. Substituting this in (14) we can find:

$$T_D = \sqrt[3]{\left[\frac{6C_T V_H}{k^2 \beta_{P3}} + \left(\frac{V_{TP}}{k}\right)^3\right]} - \left(\frac{V_{TP}}{k}\right) \quad (15)$$

4. Determination of the Size Ratios of P0, P1 and P2

The first threshold detector trips for the second time at a voltage of $2V_{TP}+\Delta V$ to be precise ($\Delta V \ll 2V_{TP}$) instead of $2V_{TP}$. This is because P0, P1 just turns on at $2V_{TP}$ and it is required to exceed it by a small amount to conduct sufficiently.

Therefore:

Using (4):

$$I_{P1} = (\tfrac{1}{8}) \cdot \beta_{P1}(\Delta V)^2 \quad (16)$$

Using (1):

$$I_{P2} = (\tfrac{1}{2}) \cdot \beta_{P2}(V_{TP}+\Delta V)^2 \quad (17)$$

The current $I_{P1}$ is multiplied by the size ratio of N0 and N1 such that:

$$I_{N1} = \frac{(W/L)_{N1}}{(W/L)_{N0}} \cdot I_{P1} \quad (18)$$

The node n3 is pulled to ground by N1 when $I_{N1}=I_{P2}$. Using this and (16), (17) and (18) we have:

$$\frac{(W/L)_{P1}}{(W/L)_{P2}} = 4 \cdot \frac{(W/L)_{N0}}{(W/L)_{N1}} \left[1 + \frac{V_{TP}}{\Delta V}\right]^2 \quad (19)$$

One should choose $\Delta V$ to be a small fraction of $V_{TP}$, as the second trip voltage of the first threshold will actually be $2V_{TP}+\Delta V$ instead of $2V_{TP}$.

5. Value of the Capacitor $C_D$

All derivations in this section assume that the power supply voltage rises to its full value $V_{DD}$ in negligible time. Therefore the capacitor $C_D$ and the parasitic capacitor $C_P$ at node n3 charge to $V_{DD}$ with constant currents from P0, P1 and P2, respectively.

Now:

$$C_P = (C_{GS})_{N2} + (C_{DS})_{N1} + (C_{DS})_{P2} \quad (20)$$

The time taken for node n3 to rise to $V_{DD}$ is:

$$T_1 = \frac{2C_P \cdot V_{DD}}{\beta_{P2}(V_{DD} - T_{TP})^2} \quad (21)$$

Similarly the time taken for node n2 to rise to $V_{TN}$, which is when N0 and N1 turn on initiating pull-down of node n3, is given by:

$$T_2 = \frac{8C_D \cdot V_{TN}}{\beta_{P1}(V_{DD} - 2V_{TP})^2} \quad (22)$$

For the correct operation of the POR circuit we must have:

$T_2 = T_1$ or $T_P$, whichever is larger  (23)

where $T_P$ is the maximum time required for N2 to discharge $C_T$. An expression for $T_P$ can be obtained, assuming $C_T$ was pre-charged to $V_{DD}$, as:

$$T_P = \sqrt[3]{\frac{24C_T \cdot C_P^2 \cdot V_{DD}}{\beta_{N2} \cdot \beta_{P2}^2 (V_{DD} - V_{TP})^4}} + \frac{2C_P \cdot V_{TN}}{\beta_{P2}(V_{DD} - V_{TP})^2} \quad (24)$$

Now using equations (20) to (24), the value of $C_D$ can be determined.

Advantages of this invention are that power-on-reset is guaranteed to occur when the circuits to be reset are powered up sufficiently to function properly, using little power and being independent of the rise time of the supply voltage. The circuit function is also relatively independent of temperature and process variations as the characteristics of the current determining transistors P0, P1 and P2 track well, both being of the same type as explained in the section Design Equations. In addition, the circuit can be designed using a few transistors of relatively small sizes and no resistors. Therefore the space taken up by this circuit is also quite small.

While the invention has been particularly shown and described with reference to the preferred embodiments thereof, it will be understood by those skilled in the art that various changes in form and details may be made without departing from the spirit and scope of the invention.

What is claimed is:

1. An integrated circuit generating a self-timed power-on-reset signal, comprising:
    a first level detector monitoring the rise of its own supply voltage and making said supply voltage available at an output only when said supply voltage ranges in value from a transistor threshold to two times said transistor threshold;
    a timing block using said output of said first level detector and charging a capacitor after said supply voltage at said output has reached two times said transistor threshold and then dropped to a voltage near ground; and
    a second level detector with a node OUT, said second level detector, using a voltage at said capacitor as input, switching said node OUT from a low voltage, equal to a power-on-reset, to said supply voltage, equal to a NOT power-on-reset, when said capacitor has exceeded a predefined voltage $V_H$, where said voltage $V_H$ equals the sum of about half said supply voltage and the threshold voltage of an n-channel transistor.

2. The circuit of claim 1, wherein said voltage at said capacitor lags in time behind the rise of said supply voltage.

3. The circuit of claim 1, wherein said power-on-reset is made active when a p-channel transistor threshold voltage $V_{TP}$ is reached, regardless of the rise time of said supply voltage.

4. The circuit of claim 1, wherein said power-on-reset is made inactive when said predefined voltage $V_H$ is exceeded, regardless of the rise time of said supply voltage.

5. The circuit of claim 1, wherein said power-on-reset resets integrated circuits, said integrated circuits using said same supply voltage.

6. An integrated circuit generating a self-timed power-on-reset signal, comprising:

a supply voltage;

a reference potential;

a first level detector connected between said supply voltage and said reference potential, said first level detector monitoring the rise of said supply voltage and providing a voltage signal at a node n3;

a timing block connected between said supply voltage and said reference potential and to said node n3, said timing block charging a capacitor and providing said capacitor's voltage signal at a node n4; and a second level detector connected between said supply voltage and said reference potential and to said node n4, said second level detector resetting a power-on-reset signal at a node OUT, when said capacitor has exceeded a predefined voltage $V_H$, where said voltage $V_H$ equals the sum of about half said supply voltage and the threshold voltage of an n-channel transistor.

7. The circuit of claim 6, wherein said first level detector comprises:

a first p-channel transistor having a source-drain path and a gate, said source of said first p-channel transistor connected to said supply voltage, and said gate of said first p-channel transistor connected to said drain of said first p-channel transistor;

a second p-channel transistor having a source-drain path, a substrate, and a gate, said source and said substrate of said second p-channel transistor connected to said drain of said first p-channel transistor, and said gate of said second p-channel transistor connected to said reference potential;

a first n-channel transistor having a drain-source path and a gate, said drain-source of said first n-channel transistor connected between said drain of said second p-channel transistor and said reference potential, and said gate of said first n-channel transistor connected to said drain of said second p-channel transistor;

a first capacitor connected between said drain of said second p-channel transistor and said reference potential;

a third p-channel transistor having a source-drain path and a gate, said source-drain of said third p-channel transistor connected between said supply voltage and said node n3, and said gate of said third p-channel transistor connected to said reference potential; and a second n-channel transistor having a drain-source path and a gate, said drain-source of said second n-channel transistor connected between said node n3 and said reference potential, and said gate of said second n-channel transistor connected to said gate of said first n-channel transistor.

8. The circuit of claim 6, wherein said timing block comprises:

a fourth p-channel transistor having a source-drain path and a gate, said source-drain of said fourth p-channel transistor connected between said supply voltage and said node n4, and said gate of said fourth p-channel transistor connected to said reference potential;

a third n-channel transistor having a drain-source path and a gate, said drain-source of said third n-channel transistor connected between said node n4 and said reference potential, and said gate of said third n-channel transistor connected to said node n3; and a second capacitor connected between said node n4 and said reference potential.

9. The circuit of claim 6, wherein said second level detector comprises:

a fifth p-channel transistor having a source-drain path and a grate, said source of said fifth p-channel transistor connected to said supply voltage, and said gate of said fifth p-channel transistor connected to said node n4;

a fourth n-channel transistor having a drain-source path and a gate, said source of said fourth n-channel transistor connected to said reference potential, and said gate of said fourth n-channel transistor connected to said node n4;

a fifth n-channel transistor having a drain-source path and a gate, said drain-source of said fifth n-channel transistor connected between said drain of said fifth p-channel transistor and said drain of said fourth n-channel transistor, and said gate of said fifth n-channel transistor connected to said node n4;

a sixth n-channel transistor having a drain-source path and a gate, said drain-source of said sixth n-channel transistor connected between said supply voltage and said drain of said fourth n-channel transistor, and said gate of said sixth n-channel transistor connected to said drain of said fifth p-channel transistor;

a sixth p-channel transistor having a source-drain path and a gate, said source-drain of said sixth p-channel transistor connected between said supply voltage and said node OUT, and said gate of said sixth p-channel transistor connected to said drain of said fifth p-channel transistor; and a seventh n-channel transistor having a drain-source path and a gate, said drain-source of said seventh n-channel transistor connected between said node OUT and said reference potential, and said gate of said seventh n-channel transistor connected to said drain of said fifth p-channel transistor.

10. The circuit of claim 7, wherein an aspect ratio of said first, said second, and said third p-channel transistor is chosen so as to reduce the steady state power consumption of said supply voltage.

11. The circuit of claim 7, wherein said first capacitor slows down the turning on of said second n-channel transistor.

12. The circuit of claim 8, wherein charging of said second capacitor starts only after said supply voltage has reached two times the threshold voltage $V_{TP}$ of a p-channel transistor.

13. The circuit of claim 8, wherein said power-on-reset signal drops to said reference potential, equal to active, when said supply voltage is rising and has reached the threshold voltage $V_{TP}$ of a p-channel transistor.

14. The circuit of claim 8, wherein said power-on-reset signal maintains said reference potential until said second capacitor has charged up to a predetermined percentage of said supply voltage, said predetermined percentage ranging from 75 to 85 percent.

15. The circuit of claim 14, wherein said power-on-reset signal switches to said supply voltage level, equal to inactive, once said predetermined percentage of said supply voltage has been exceeded.

16. A method of generating a self-timed power-on-reset, comprising the steps of:

providing a supply voltage rising to a fixed voltage;

providing a first level detecting means to set a power-on-reset signal to logical zero (active) when said supply is at the threshold voltage $V_{TP}$ of a p-channel transistor;

detecting when said supply voltage is at two times said threshold voltage $V_{TP}$;

providing a timing means that starts charging a capacitor when said supply voltage is at two times said threshold voltage $V_{TP}$;

charging said capacitor at such a rate that the voltage impressed on said capacitor lags behind the voltage of said rising supply voltage; and providing a second level detecting means that switches said power-on-reset to logical one (inactive) at a predetermined voltage $V_H$, when said voltage impressed on said capacitor has risen from two times the threshold voltage of said p-channel transistor to said predetermined voltage $V_H$, where said voltage $V_H$ equals the sum of about half said supply voltage and the threshold voltage of an n-channel transistor.

17. The method of claim 16, wherein said supply voltage supplies power to said first level detecting means.

18. The method of claim 16, wherein said supply voltage supplies power to said timing means.

19. The method of claim 16, wherein said supply voltage supplies power to said second level detecting means.

20. The method of claim 16, wherein said supply voltage supplies power to digital circuits receiving said power-on-reset signal.

21. The method of claim 16, wherein said timing means charges said capacitor to said predetermined voltage in a time determined to be sufficient for a complete power-on-reset.

* * * * *